(12) United States Patent
Yu et al.

(10) Patent No.: US 11,594,520 B2
(45) Date of Patent: Feb. 28, 2023

(54) SEMICONDUCTOR PACKAGE FOR THERMAL DISSIPATION

(71) Applicant: Taiwan Semiconductor Manufacturing Co., Ltd., Hsinchu (TW)

(72) Inventors: Chen-Hua Yu, Hsinchu (TW); Shin-Puu Jeng, Hsinchu (TW); Der-Chyang Yeh, Hsinchu (TW); Hsien-Wei Chen, Hsinchu (TW); Cheng-Chieh Hsieh, Tainan (TW); Ming-Yen Chiu, Zhubei (TW)

(73) Assignee: TAIWAN SEMICONDUCTOR MANUFACTURING COMPANY, Hsin-Chu (TW)

(*) Notice: Subject to any disclaimer, the term of this patent is extended or adjusted under 35 U.S.C. 154(b) by 147 days.

(21) Appl. No.: 17/073,953

(22) Filed: Oct. 19, 2020

(65) Prior Publication Data

US 2021/0057387 A1 Feb. 25, 2021

Related U.S. Application Data

(60) Continuation of application No. 16/230,965, filed on Dec. 21, 2018, now Pat. No. 10,811,389, which is a
(Continued)

(51) Int. Cl.
*H01L 23/34* (2006.01)
*H01L 25/065* (2023.01)
(Continued)

(52) U.S. Cl.
CPC ...... *H01L 25/0657* (2013.01); *H01L 21/4853* (2013.01); *H01L 21/568* (2013.01); *H01L 23/3128* (2013.01); *H01L 23/3675* (2013.01); *H01L 23/3677* (2013.01); *H01L 23/49811* (2013.01); *H01L 23/49816* (2013.01); *H01L 23/49838* (2013.01); *H01L 25/105* (2013.01); *H01L 23/5389* (2013.01); *H01L 24/03* (2013.01); *H01L 24/05* (2013.01);
(Continued)

(58) Field of Classification Search
CPC ........... H01L 23/3128; H01L 23/49811; H01L 23/49838; H01L 24/08
USPC .................................................. 257/737, 778
See application file for complete search history.

(56) References Cited

U.S. PATENT DOCUMENTS 5,410,805 A * 5/1995 Pasch .................. G03F 7/70433
257/E31.127
5,634,268 A  6/1997 Dalal et al.
(Continued)

FOREIGN PATENT DOCUMENTS

CN  1185859 A  6/1998
CN  1359151 A  7/2002
(Continued)

*Primary Examiner* — Nitin Parekh
(74) *Attorney, Agent, or Firm* — Slater Matsil, LLP

(57) ABSTRACT

A first package is bonded to a first substrate with first external connections and second external connections. The second external connections are formed using materials that are different than the first external connections in order to provide a thermal pathway from the first package. In a particular embodiment the first external connections are solder balls and the second external connections are copper blocks.

20 Claims, 10 Drawing Sheets

Related U.S. Application Data division of application No. 15/243,694, filed on Aug. 22, 2016, now Pat. No. 10,163,861, which is a division of application No. 14/321,365, filed on Jul. 1, 2014, now Pat. No. 9,449,947.

(51) Int. Cl.

| | | |
|---|---|---|
| *H01L 23/498* | (2006.01) | |
| *H01L 21/56* | (2006.01) | |
| *H01L 25/10* | (2006.01) | |
| *H01L 23/367* | (2006.01) | |
| *H01L 23/31* | (2006.01) | |
| *H01L 21/48* | (2006.01) | |
| *H01L 23/00* | (2006.01) | |
| *H01L 23/538* | (2006.01) | |
| *H01L 25/16* | (2023.01) | |

(52) U.S. Cl.
CPC ............. *H01L 24/08* (2013.01); *H01L 24/80* (2013.01); *H01L 25/16* (2013.01); *H01L 2224/0345* (2013.01); *H01L 2224/0361* (2013.01); *H01L 2224/05624* (2013.01); *H01L 2224/05647* (2013.01); *H01L 2224/08225* (2013.01); *H01L 2224/80006* (2013.01); *H01L 2224/80904* (2013.01); *H01L 2224/9202* (2013.01); *H01L 2225/0652* (2013.01); *H01L 2225/06517* (2013.01); *H01L 2225/06548* (2013.01); *H01L 2225/06555* (2013.01); *H01L 2225/06572* (2013.01); *H01L 2225/06589* (2013.01); *H01L 2924/15311* (2013.01); *H01L 2924/181* (2013.01); *H01L 2924/18161* (2013.01)

(56) References Cited

U.S. PATENT DOCUMENTS

| | | | |
|---|---|---|---|
| 5,804,882 A | 9/1998 | Tsukagoshi et al. | |
| 6,333,561 B1 | 12/2001 | Chen | |
| 6,555,906 B2 | 4/2003 | Towle et al. | |
| 7,045,883 B1* | 5/2006 | McCann | H01L 24/17 |
| | | | 257/690 |
| 7,619,901 B2 | 11/2009 | Eichelberger et al. | |
| 7,863,088 B2 | 1/2011 | Brunnbauer et al. | |
| 7,989,959 B1* | 8/2011 | Rahman | H01L 25/0657 |
| | | | 438/109 |
| 8,039,303 B2 | 10/2011 | Shim et al. | |
| 8,072,059 B2 | 12/2011 | Shim et al. | |
| 8,097,490 B1 | 1/2012 | Pagaila et al. | |
| 8,133,762 B2 | 3/2012 | Pagaila et al. | |
| 8,193,604 B2 | 6/2012 | Lin et al. | |
| 8,283,205 B2 | 10/2012 | Pagaila et al. | |
| 8,291,584 B2 | 10/2012 | Tanaka | |
| 8,319,338 B1 | 11/2012 | Berry et al. | |
| 8,330,273 B2 | 12/2012 | Brunnbauer et al. | |
| 8,354,304 B2 | 1/2013 | Chow et al. | |
| 8,361,842 B2 | 1/2013 | Yu et al. | |
| 8,474,133 B2 | 7/2013 | Eichelberger et al. | |
| 8,476,824 B2 | 7/2013 | Yu et al. | |
| 8,609,465 B2 | 12/2013 | Kawahara | |
| 8,680,647 B2 | 3/2014 | Yu et al. | |
| 8,703,542 B2 | 4/2014 | Lin et al. | |
| 8,729,709 B2* | 5/2014 | Baba | H01L 23/49811 |
| | | | 361/767 |
| 8,741,690 B2 | 6/2014 | Meyer et al. | |
| 8,742,579 B2 | 6/2014 | Pagaila et al. | |
| 8,759,147 B2 | 6/2014 | Choi et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,796,846 B2 | 8/2014 | Lin et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 8,889,484 B2 | 11/2014 | Chen et al. | |
| 8,916,969 B2 | 12/2014 | Chen et al. | |
| 8,928,128 B2 | 1/2015 | Karikalan et al. | |
| 8,952,521 B2 | 2/2015 | Wojnowski et al. | |
| 8,975,741 B2 | 3/2015 | Lin et al. | |
| 9,000,583 B2 | 4/2015 | Haba et al. | |
| 9,048,222 B2 | 6/2015 | Hung et al. | |
| 9,171,791 B2* | 10/2015 | Baba | H01L 23/50 |
| 9,378,982 B2 | 6/2016 | Lin et al. | |
| 9,460,987 B2 | 10/2016 | Hung et al. | |
| 9,659,805 B2 | 5/2017 | Hu et al. | |
| 9,685,411 B2 | 6/2017 | Chen | |
| 9,799,631 B2 | 10/2017 | Lin et al. | |
| 9,922,903 B2 | 3/2018 | Hung et al. | |
| 10,269,685 B2 | 4/2019 | Hung et al. | |
| 10,276,536 B2 | 4/2019 | Pei et al. | |
| 10,515,875 B2 | 12/2019 | Hung et al. | |
| 2005/0277550 A1 | 12/2005 | Brown et al. | |
| 2006/0038291 A1 | 2/2006 | Chung et al. | |
| 2006/0194331 A1 | 8/2006 | Pamula et al. | |
| 2007/0227765 A1 | 10/2007 | Sakamoto et al. | |
| 2007/0287230 A1 | 12/2007 | Kuramochi et al. | |
| 2008/0029886 A1 | 2/2008 | Cotte et al. | |
| 2008/0044944 A1 | 2/2008 | Wakisaka et al. | |
| 2008/0157330 A1 | 7/2008 | Kroehnert et al. | |
| 2008/0284035 A1 | 11/2008 | Brunnbauer et al. | |
| 2009/0008765 A1 | 1/2009 | Yamano et al. | |
| 2009/0053858 A1 | 2/2009 | Ko et al. | |
| 2009/0236752 A1 | 9/2009 | Lee et al. | |
| 2009/0293271 A1 | 12/2009 | Tanaka | |
| 2010/0133704 A1 | 6/2010 | Marimuthu et al. | |
| 2011/0042820 A1* | 2/2011 | Knickerbocker | |
| | | | H01L 21/76898 |
| | | | 257/E21.589 |
| 2011/0193216 A1 | 8/2011 | Lin et al. | |
| 2011/0291288 A1 | 12/2011 | Wu et al. | |
| 2012/0062439 A1 | 3/2012 | Liao et al. | |
| 2012/0112355 A1 | 5/2012 | Pagaila et al. | |
| 2012/0119378 A1 | 5/2012 | Ng et al. | |
| 2012/0126396 A1* | 5/2012 | Zhao | H01L 23/36 |
| | | | 257/737 |
| 2012/0171814 A1 | 7/2012 | Choi et al. | |
| 2012/0199981 A1 | 8/2012 | Jeong et al. | |
| 2012/0208319 A1 | 8/2012 | Meyer et al. | |
| 2012/0231584 A1 | 9/2012 | Kawahara | |
| 2012/0319284 A1 | 12/2012 | Ko et al. | |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0105991 A1 | 5/2013 | Gan et al. | |
| 2013/0168848 A1 | 7/2013 | Lin et al. | |
| 2013/0168857 A1* | 7/2013 | Gregorich | H01L 25/0657 |
| | | | 257/E23.021 |
| 2013/0187268 A1 | 7/2013 | Lin et al. | |
| 2013/0249101 A1 | 9/2013 | Lin et al. | |
| 2013/0270685 A1 | 10/2013 | Yim et al. | |
| 2013/0297981 A1 | 11/2013 | Gu et al. | |
| 2013/0307140 A1 | 11/2013 | Huang et al. | |
| 2013/0328212 A1 | 12/2013 | Chino | |
| 2014/0061937 A1 | 3/2014 | Hu et al. | |
| 2014/0077394 A1 | 3/2014 | Chang et al. | |
| 2014/0091471 A1 | 4/2014 | Chen et al. | |
| 2014/0110840 A1 | 4/2014 | Wojnowski et al. | |
| 2014/0203429 A1 | 7/2014 | Yu et al. | |
| 2014/0203443 A1 | 7/2014 | Pagaila et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2015/0255431 A1 | 9/2015 | Su et al. | |
| 2015/0255432 A1 | 9/2015 | Lin et al. | |
| 2015/0255447 A1 | 9/2015 | Hung et al. | |
| 2016/0148857 A1 | 5/2016 | Lin et al. | |

(56) References Cited

U.S. PATENT DOCUMENTS

2016/0358894 A1   12/2016  Yu et al.
2017/0229432 A1    8/2017  Lin et al.

FOREIGN PATENT DOCUMENTS

| | | |
|---|---|---|
| CN | 1738017 A | 2/2006 |
| CN | 101308803 A | 11/2008 |
| CN | 102576682 A | 7/2012 |
| CN | 102903691 A | 1/2013 |
| CN | 103219307 A | 7/2013 |
| CN | 103325727 A | 9/2013 |
| CN | 103972191 A | 8/2014 |
| DE | 10110453 A1 | 5/2002 |
| DE | 102005040213 A1 | 3/2006 |
| DE | 102005043557 A1 | 9/2006 |
| DE | 102011001405 A1 | 10/2011 |
| JP | 2012199494 A | 10/2012 |
| KR | 20120077875 A | 7/2012 |
| KR | 20120101885 A | 9/2012 |
| KR | 20130035805 A | 4/2013 |
| KR | 20130052179 A | 5/2013 |
| KR | 20130116100 A | 10/2013 |
| KR | 20140043651 A | 4/2014 |
| TW | 201413882 A | 4/2014 |
| TW | 201431039 A | 8/2014 |
| TW | 201436067 A | 9/2014 |

\* cited by examiner

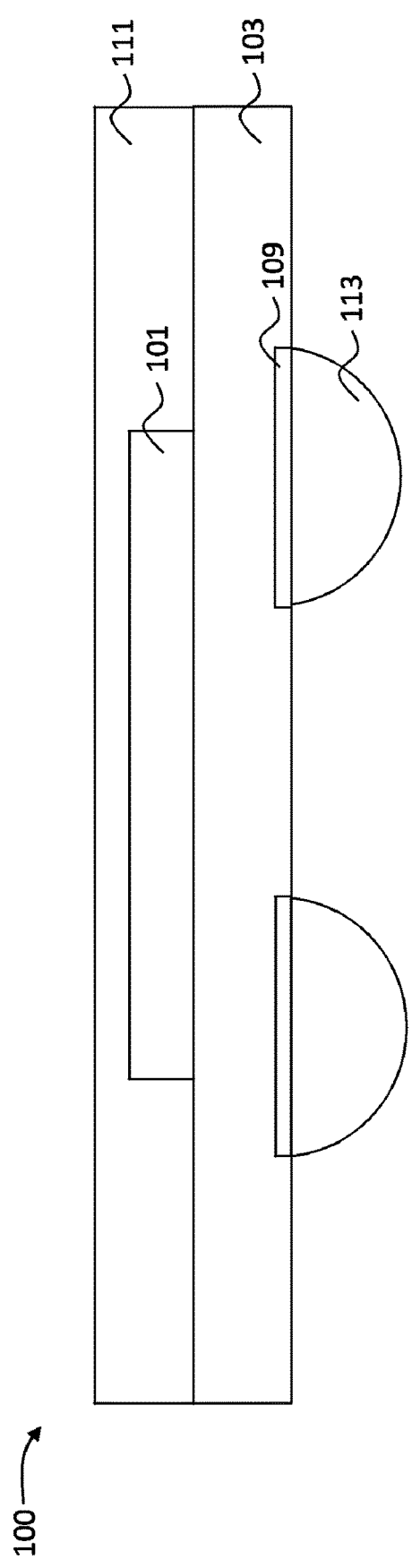
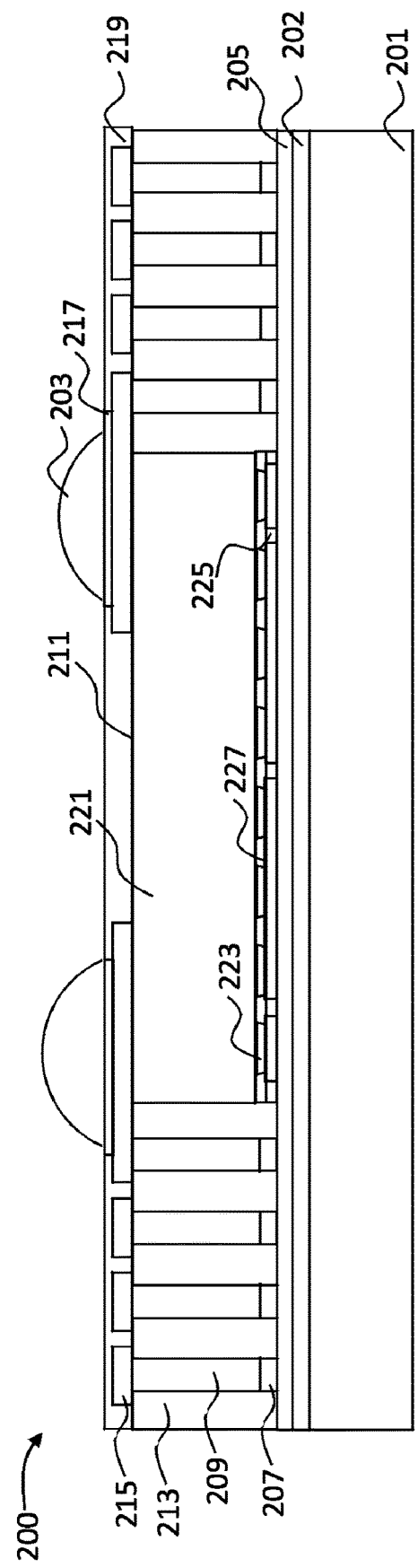
Figure 1
Figure 2A

SEMICONDUCTOR PACKAGE FOR THERMAL DISSIPATION

PRIORITY CLAIM AND CROSS-REFERENCE

This application is a continuation of U.S. patent application Ser. No. 16/230,965, filed Dec. 21, 2018, which is a divisional of U.S. patent application Ser. No. 15/243,694, filed Aug. 22, 2016, now U.S. Pat. No. 10,163,861, issued Dec. 25, 2018 and entitled, "Semiconductor Package for Thermal Dissipation," which is a divisional of U.S. patent application Ser. No. 14/321,365, filed on Jul. 1, 2014, now U.S. Pat. No. 9,449,947, issued Sep. 20, 2016 and entitled "Semiconductor Package for Thermal Dissipation," which application is hereby incorporated by reference.

BACKGROUND

Since the invention of the integrated circuit (IC), the semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D IC formation, there are physical limits to the density that can be achieved in two dimensions. One of these limits is the minimum size needed to make these components. Also, when more devices are put into one chip, more complex designs are utilized.

In an attempt to further increase circuit density, three-dimensional (3D) ICs have been investigated. In a typical formation process of a 3D IC, two dies are bonded together and electrical connections are formed between each die and contact pads on a substrate. For example, one attempt involved bonding two dies on top of each other. The stacked dies were then bonded to a carrier substrate and wire bonds electrically coupled contact pads on each die to contact pads on the carrier substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 illustrates a first package in accordance with some embodiments.

FIGS. 2A-2B illustrate a second package in accordance with some embodiments.

DETAILED DESCRIPTION

Figure 2B:
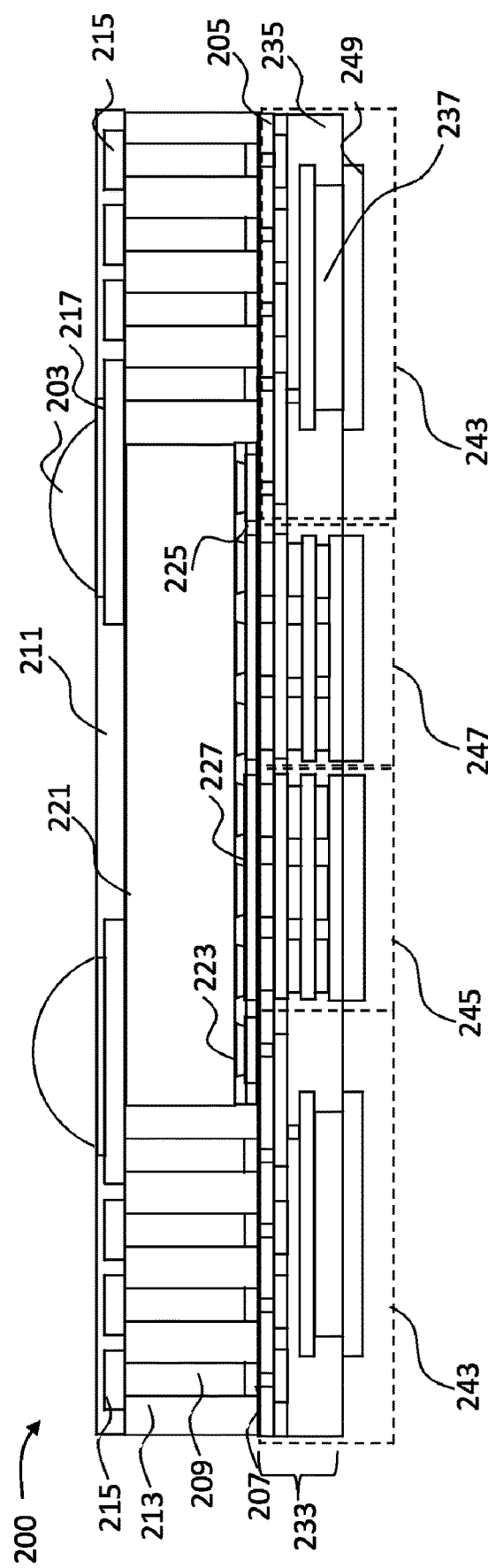

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With reference now to FIG. 1, there is shown a first package 100. The first package 100 may comprise a first substrate 103, a first semiconductor device 101, first contact pads 109, a first encapsulant 111, and first external connections 113. In an embodiment the first substrate 103 may be, e.g., a packaging substrate comprising internal interconnects to connect the first semiconductor device 101 to other external devices such as a second package 200 (not illustrated in FIG. 1 but illustrated and described below with respect to FIGS. 2A-2B).

Alternatively, the first substrate 103 may be an interposer used as an intermediate substrate to connect the first semiconductor device 101 to the other external devices. In this embodiment the first substrate 103 may be, e.g., a silicon substrate, doped or undoped, or an active layer of a silicon-on-insulator (SOI) substrate. However, the first substrate 103 may alternatively be a glass substrate, a ceramic substrate, a polymer substrate, or any other substrate that may provide a suitable protection and/or interconnection functionality. These and any other suitable materials may alternatively be used for the first substrate 103.

The first semiconductor device 101 may be a semiconductor device designed for an intended purpose such as being a logic die, a central processing unit (CPU) die, a memory die, combinations of these, or the like. In an embodiment the first semiconductor device 101 comprises integrated circuit devices, such as transistors, capacitors, inductors, resistors, first metallization layers (not shown), and the like, therein, as desired for a particular functionality. In an embodiment the first semiconductor device 101 is designed and manufactured to work in conjunction with or concurrently with a second semiconductor device 211 (not illustrated in FIG. 1 but illustrated and described below with respect to FIGS. 2A-2B).

The first contact pads 109 may be formed on the first substrate 103 to form electrical connections between the first semiconductor device 101 and, e.g., first external connections 113. In an embodiment the first contact pads 109 may be formed over and in electrical contact with electrical routing (not separately illustrated in FIG. 1) within the first substrate 103. The first contact pads 109 may comprise aluminum, but other materials, such as copper, may alternatively be used. The first contact pads 109 may be formed using a deposition process, such as sputtering, to form a layer of material (not shown) and portions of the layer of material may then be removed through a suitable process (such as photolithographic masking and etching) to form the first contact pads 109. However, any other suitable process may be utilized to form the first contact pads 109. The first contact pads 109 may be formed to have a thickness of between about 0.5 µm and about 4 µm, such as about 1.45 µm.

The first encapsulant 111 may be used to encapsulate and protect the first semiconductor device 101 and the first substrate 103. In an embodiment the first encapsulant 111 may be a molding compound and may be placed using a molding device (not illustrated in FIG. 1). For example, the first substrate 103 and the first semiconductor device 101 may be placed within a cavity of the molding device, and the cavity may be hermetically sealed. The first encapsulant 111 may be placed within the cavity either before the cavity is hermetically sealed or else may be injected into the cavity through an injection port. In an embodiment the first encapsulant 111 may be a molding compound resin such as polyimide, PPS, PEEK, PES, a heat resistant crystal resin, combinations of these, or the like.

Once the first encapsulant 111 has been placed into the cavity such that the first encapsulant 111 encapsulates the region around the first substrate 103 and the first semiconductor device 101, the first encapsulant 111 may be cured in order to harden the first encapsulant 111 for optimum protection. While the exact curing process is dependent at least in part on the particular material chosen for the first encapsulant 111, in an embodiment in which molding compound is chosen as the first encapsulant 111, the curing could occur through a process such as heating the first encapsulant 111 to between about 100° C. and about 130° C., such as about 125° C. for about 60 sec to about 3000 sec, such as about 600 sec. Additionally, initiators and/or catalysts may be included within the first encapsulant 111 to better control the curing process.

However, as one having ordinary skill in the art will recognize, the curing process described above is merely an exemplary process and is not meant to limit the current embodiments. Other curing processes, such as irradiation or even allowing the first encapsulant 111 to harden at ambient temperature, may alternatively be used. Any suitable curing process may be used, and all such processes are fully intended to be included within the scope of the embodiments discussed herein In an embodiment the first external connections 113 may be formed to provide an external connection between the first substrate 103 and, e.g., second external connections 203 (not illustrated in FIG. 1 but illustrated and described below with respect to FIGS. 2A-2B). The first external connections 113 may be contact bumps such as microbumps or controlled collapse chip connection (C4) bumps and may comprise a material such as tin, or other suitable materials, such as silver or copper. In an embodiment in which the first external connections 113 are tin solder bumps, the first external connections 113 may be formed by initially forming a layer of tin through any suitable method such as evaporation, electroplating, printing, solder transfer, ball placement, etc, to a thickness of, e.g., about 100 µm. Once a layer of tin has been formed on the structure, a reflow is performed in order to shape the material into the desired bump shape.

FIG. 2A illustrates an intermediate product in a process of forming, e.g., a second package 200, such as an integrated fan out (InFO) package. As illustrated in FIG. 2A, the intermediate structure comprises a carrier substrate 201, an adhesive layer 202, a polymer layer 205, a seed layer 207, vias 209, a second semiconductor device 211, a second encapsulant 213, a first redistribution layer 215, second contact pads 217, a first passivation layer 219, and second external connections 203. The carrier substrate 201 comprises, for example, silicon based materials, such as glass or silicon oxide, or other materials, such as aluminum oxide, combinations of any of these materials, or the like. The carrier substrate 201 is planar in order to accommodate an attachment of semiconductor devices such as the second semiconductor device 211.

The adhesive layer 202 is placed on the carrier substrate 201 in order to assist in the adherence of overlying structures (e.g., the polymer layer 205). In an embodiment the adhesive layer 202 may comprise an ultra-violet glue, which loses its adhesive properties when exposed to ultra-violet light. However, other types of adhesives, such as pressure sensitive adhesives, radiation curable adhesives, epoxies, combinations of these, or the like, may also be used. The adhesive layer 202 may be placed onto the carrier substrate 201 in a semi-liquid or gel form, which is readily deformable under pressure.

The polymer layer 205 is placed over the adhesive layer 202 and is utilized in order to provide protection to, e.g., the second semiconductor device 211 once the second semiconductor device 211 has been attached. In an embodiment the polymer layer 205 may be polybenzoxazole (PBO), although any suitable material, such as polyimide or a polyimide derivative, may alternatively be utilized. The polymer layer 205 may be placed using, e.g., a spin-coating process to a thickness of between about 2 µm and about 15 µm, such as about 5 µm, although any suitable method and thickness may alternatively be used.

The seed layer 207 is a thin layer of a conductive material that aids in the formation of a thicker layer during subsequent processing steps. The seed layer 207 may comprise a layer of titanium about 1,000 Å thick followed by a layer of copper about 5,000 Å thick. The seed layer 207 may be created using processes such as sputtering, evaporation, or PECVD processes, depending upon the desired materials. The seed layer 207 may be formed to have a thickness of between about 0.3 µm and about 1 µm, such as about 0.5 µm.

Once the seed layer 207 has been formed, a photoresist (not illustrated in FIG. 2A) may be placed and patterned over the seed layer 207. In an embodiment the photoresist may be placed on the seed layer 207 using, e.g., a spin coating technique to a height of between about 50 µm and about 250 µm, such as about 120 µm. Once in place, the photoresist may then be patterned by exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern.

In an embodiment the pattern formed into the photoresist is a pattern for the vias 209. The vias 209 are formed in such a placement as to be located on different sides of subsequently attached devices such as the second semiconductor device 211. However, any suitable arrangement for the pattern of vias 209 may alternatively be utilized.

Once the photoresist has been patterned, the vias 209 are formed within the photoresist. In an embodiment the vias 209 comprise one or more conductive materials, such as copper, tungsten, other conductive metals, or the like, and may be formed, for example, by electroplating, electroless plating, or the like. In an embodiment, an electroplating process is used wherein the seed layer 207 and the photoresist are submerged or immersed in an electroplating solution. The seed layer 207 surface is electrically connected to the negative side of an external DC power supply such that the seed layer 207 functions as the cathode in the electroplating process. A solid conductive anode, such as a copper anode, is also immersed in the solution and is attached to the positive side of the power supply. The atoms from the anode are dissolved into the solution, from which the cathode, e.g., the seed layer 207, acquires the dissolved atoms, thereby plating the exposed conductive areas of the seed layer 207 within the opening of the photoresist.

Once the vias 209 have been formed using the photoresist and the seed layer 207, the photoresist may be removed using a suitable removal process. In an embodiment, a plasma ashing process may be used to remove the photoresist, whereby the temperature of the photoresist may be increased until the photoresist experiences a thermal decomposition and may be removed. However, any other suitable process, such as a wet strip, may alternatively be utilized. The removal of the photoresist may expose the underlying portions of the seed layer 207.

After the removal of the photoresist exposes the underlying seed layer 207, these portions are removed. In an embodiment the exposed portions of the seed layer 207 (e.g., those portions that are not covered by the vias 209) may be removed by, for example, a wet or dry etching process. For example, in a dry etching process reactants may be directed towards the seed layer 207, using the vias 209 as masks. Alternatively, etchants may be sprayed or otherwise put into contact with the seed layer 207 in order to remove the exposed portions of the seed layer 207. After the exposed portion of the seed layer 207 has been etched away, a portion of the polymer layer 205 is exposed between the vias 209.

After the vias 209 have been formed, the second semiconductor device 211 may be placed on the exposed polymer layer 205. In an embodiment the second semiconductor device 211 may be similar to the first semiconductor device 101, such as by being a logic die, a memory die, a CPU die, combinations of these, or the like. In an embodiment the second semiconductor device 211 is designed and manufactured to work either with or concurrently with the first semiconductor device 101. The second semiconductor device 211 may be attached to the polymer layer 205 using, e.g., an adhesive material, although any suitable method of attachment may alternatively be utilized.

In an embodiment the second semiconductor device 211 comprises a second substrate 221, active devices (not separately illustrated), second metallization layers 223, a second passivation layer 225, and second contact pads 227. The second substrate 221 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The active devices within the second semiconductor device 211 comprise a wide variety of active devices and passive devices such as capacitors, resistors, inductors and the like that may be used to generate the desired structural and functional desires of the design for the second semiconductor device 211. The active devices within the second semiconductor device 211 may be formed using any suitable methods either within or else on the second substrate 221.

The second metallization layers 223 are formed over the second substrate 221 and the active devices within the second semiconductor device 211 and are designed to connect the various active devices within the second semiconductor device 211 to form functional circuitry. In an embodiment the second metallization layers 223 are formed of alternating layers of dielectric and conductive material and may be formed through any suitable process (such as deposition, damascene, dual damascene, etc.). In an embodiment there may be four layers of metallization separated from the second substrate 221 by at least one interlayer dielectric layer (ILD), but the precise number of second metallization layers 223 is dependent upon the design of the second semiconductor device 211.

The second contact pads 227 may be formed over and in electrical contact with the second metallization layers 223. The second contact pads 227 may comprise aluminum, but other materials, such as copper, may alternatively be used. The second contact pads 227 may be formed using a deposition process, such as sputtering, to form a layer of material (not shown) and portions of the layer of material may then be removed through a suitable process (such as photolithographic masking and etching) to form the second contact pads 227. However, any other suitable process may be utilized to form the second contact pads 227. The second contact pads 227 may be formed to have a thickness of between about 0.5 µm and about 4 µm, such as about 1.45 µm.

The second passivation layer 225 may be formed on the second substrate 221 over the second metallization layers 223 and the second contact pads 227. The second passivation layer 225 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The second passivation layer 225 may be formed through a process such as chemical vapor deposition (CVD), although any suitable process may be utilized, and may have a thickness between about 0.5 µm and about 5 µm, such as about 9.25 KÅ. Once in place the second contact pads 227 may be exposed by removing a portion of the second passivation layer 225 through a process such as chemical mechanical polishing (CMP) although any suitable removal process may be used.

Once the second semiconductor device 211 has been placed between the vias 209, the second semiconductor device 211 and the vias 209 may be encapsulated with a second encapsulant 213. The encapsulation may be performed in a molding device (not individually illustrated in FIG. 2A). For example, the second semiconductor device 211 and the vias 209 may be placed within a cavity of the molding device, and the cavity may be hermetically sealed. The second encapsulant 213 may be placed within the cavity either before the cavity is hermetically sealed or else may be injected into the cavity through an injection port. In an embodiment the second encapsulant 213 may be a molding compound resin such as polyimide, PPS, PEEK, PES, a heat resistant crystal resin, combinations of these, or the like.

Once the second encapsulant 213 has been placed into the molding cavity such that the second encapsulant 213 encapsulates the carrier substrate 201, the vias 209, and the second semiconductor device 211, the second encapsulant 213 may be cured in order to harden the second encapsulant 213 for optimum protection. While the exact curing process is dependent at least in part on the particular material chosen for the second encapsulant 213, in an embodiment in which molding compound is chosen as the second encapsulant 213, the curing could occur through a process such as heating the second encapsulant 213 to between about 100° C. and about 130° C., such as about 125° C. for about 60 sec to about 3000 sec, such as about 600 sec. Additionally, initiators and/or catalysts may be included within the second encapsulant 213 to better control the curing process.

However, as one having ordinary skill in the art will recognize, the curing process described above is merely an exemplary process and is not meant to limit the current embodiments. Other curing processes, such as irradiation or even allowing the second encapsulant 213 to harden at ambient temperature, may alternatively be used. Any suitable curing process may be used, and all such processes are fully intended to be included within the scope of the embodiments discussed herein.

Once the second encapsulant 213 has been placed, the second encapsulant 213 is thinned in order to expose the vias 209 and, optionally, the second semiconductor device 211 for further processing. The thinning may be performed, e.g., using a mechanical grinding or chemical mechanical polishing (CMP) process whereby chemical etchants and abrasives are utilized to react and grind away the second encapsulant 213 and the second semiconductor device 211 until the vias 209 and the second semiconductor device 211 have been exposed. As such, the second semiconductor device 211 and the vias 209 may have a planar surface that is also planar with the second encapsulant 213.

However, while the CMP process described above is presented as one illustrative embodiment, it is not intended to be limiting to the embodiments. Any other suitable removal process may alternatively be used to thin the second encapsulant 213 and the second semiconductor device 211 and expose the vias 209. For example, a series of chemical etches may alternatively be utilized. This process and any other suitable process may alternatively be utilized to thin the second encapsulant 213 and the second semiconductor device 211, and all such processes are fully intended to be included within the scope of the embodiments.

The first redistribution layer 215 is utilized to interconnect the second semiconductor device 211, the vias 209 and the first package 100 (see FIG. 1). In an embodiment the first redistribution layer 215 is formed by initially forming a seed layer (not shown) of, e.g., a titanium copper alloy through a suitable formation process such as CVD or sputtering. A photoresist (also not shown) may then be formed to cover the seed layer, and the photoresist may then be patterned to expose those portions of the seed layer that are located where the first redistribution layer 215 is desired to be located.

Once the photoresist has been formed and patterned, a conductive material, such as copper, may be formed on the seed layer through a deposition process such as plating. The conductive material may be formed to have a thickness of between about 1 µm and about 10 µm, such as about 5 µm, and a width of between about 5 µm and about 300 µm, such as about 5 µm. However, while the material and methods discussed are suitable to form the conductive material, these materials are merely exemplary. Any other suitable materials, such as AlCu or Au, and any other suitable processes of formation, such as CVD or PVD followed by a patterning process, may alternatively be used to form the first redistribution layer 215.

Once the conductive material has been formed, the photoresist may be removed through a suitable removal process such as ashing. Additionally, after the removal of the photoresist, those portions of the seed layer that were covered by the photoresist may be removed through, for example, a suitable etch process using the conductive material as a mask.

Once the first redistribution layer 215 has been formed, second contact pads 217 are formed in order to electrically interconnect the first redistribution layer 215 to, e.g., the second external connections 203. In an embodiment the second contact pads 217 are similar to the first contact pads 109 (described above with respect to FIG. 1), such as by being aluminum contact pads formed using a deposition process such as sputtering and then patterned. However, the second contact pads 217 may be formed from any suitable material and using any suitable process.

The first passivation layer 219 may be formed over the first redistribution layer 215 and the second contact pads 217 in order to provide protection and isolation for the first redistribution layer 215 and the other underlying structures. In an embodiment the first passivation layer 219 may be polybenzoxazole (PBO), although any suitable material, such as polyimide or a polyimide derivative, may alternatively be utilized. The first passivation layer 219 may be placed using, e.g., a spin-coating process to a thickness of between about 5 µm and about 25 µm, such as about 7 µm, although any suitable method and thickness may alternatively be used. Once in place, the second contact pads 217 may be exposed through the first passivation layer 219 be removing a portion of the first passivation layer 219 through a process such as chemical mechanical polishing (CMP), although any suitable removal process may alternatively be utilized.

The second external connections 203 are formed in connection with the second contact pads 217. In an embodiment the second external connections 203 are similar to the first external connections 113 (described above with respect to FIG. 1), such as by being contact bumps such as microbumps or controlled collapse chip connection (C4) bumps. However, any other suitable type of electrical connection may alternatively be utilized for the second external connections 203.

FIG. 2B illustrates further processing in the formation of the second package 200. In an embodiment the carrier substrate 201 and the adhesive layer 202 are debonded from the remainder of the structure using, e.g., a thermal process to alter the adhesive properties of the adhesive layer 202. In a particular embodiment an energy source such as an ultraviolet (UV) laser, a carbon dioxide ($CO_2$) laser, or an infrared (IR) laser, is utilized to irradiate and heat the adhesive layer 202 until the adhesive layer 202 loses at least some of its adhesive properties. Once performed, the carrier substrate 201 and the adhesive layer 202 may be physically separated and removed from the structure.

Additionally, once the carrier substrate 201 and the adhesive layer 202 have been removed, the polymer layer 205 may be patterned in order to expose the vias 209 and the second contact pads 227. In an embodiment the polymer layer 205 is patterned by initially applying a photoresist (not individually illustrated in FIG. 2B) to the polymer layer 205 and then exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern, and the underlying exposed portion of the polymer layer 205 are removed with, e.g., a dry etch process. However, any other suitable method for patterning the polymer layer 205 may alternatively be utilized.

FIG. 2B also illustrates a formation of third metallization layers 233 in electrical connection with the vias 209 and the second contact pads 227 in order to interconnect the vias 209 and the second contact pads 227 with, e.g., an external device such as a second substrate 401 (not illustrated in FIG. 2B but illustrated and described below with respect to FIG. 4). The third metallization layers 233 are formed of alternating layers of dielectric material 235 and conductive material 237, wherein the conductive material 237 is interconnected vertically with vias and may be formed through any suitable process (such as deposition, damascene, dual damascene, etc.). In an embodiment there may be four layers of metallization, but the precise number of third metallization layers 233 is dependent upon the design of the second package 200.

In an embodiment the second metallization layers 223 is separated into three distinct regions: a signal region 243, a power region 245, and a ground region 247. The signal region 243, as its name suggests, comprises metallization and vias that work to carry signals to and from the vias 209 and the second semiconductor device 211. In an embodiment the vias and metallization within the signal region 243 are designed and sized in order to provide a suitable routing for signals to and from the vias 209 and the second semiconductor device 211. For example, the vias within the signal region 243 may have a first diameter of between about 5 μm and about 20 μm, such as about 20 μm, while the metallization may have a first thickness of between about 1.5 μm and about 5.0 μm, such as about 2.0 μm. However, any other suitable dimensions may alternatively be utilized.

The power region 245, as its name suggests, comprises metallization and vias that work to distribute power to the second semiconductor device 211. In addition, the vias and metallization within the power region 245 will also serve as a thermal conduit to remove heat from the second semiconductor device 211. As such, the vias and metallization within the power region 245 may be sized differently from the vias and metallization in the signal region 243 in order to accommodate the additional heat transfer. In an embodiment the vias within the power region 245 may have a second diameter of between about 5 μm and about 75 μm, such as about 60 μm, while the metallization may have a second thickness of between about 1.5 μm and about 5 μm, such as about 2 μm. However, any other suitable dimensions may alternatively be utilized.

The ground region 247, as its name suggests, supplies a ground potential for the second semiconductor device 211. Additionally, in an embodiment the ground region 247 also works in conjunction with the power region 245 to remove heat from the second semiconductor device 211. As such, the vias and metallization within the ground region 247 may be sized similarly to the vias and metallization within the power region 245, although they may be sized differently if desired.

Once the second metallization layers 223 have been formed, third contact pads 249 may be formed to provide an electrical connection between the third metallization layers 233 and, e.g., the second substrate 401. In an embodiment the third contact pads 249 are similar to the first contact pads 109 (described above with respect to FIG. 1). For example, the third contact pads 249 may be aluminum contact pads formed using a deposition and patterning process, although any other suitable process may alternatively be utilized.

Figure 3:
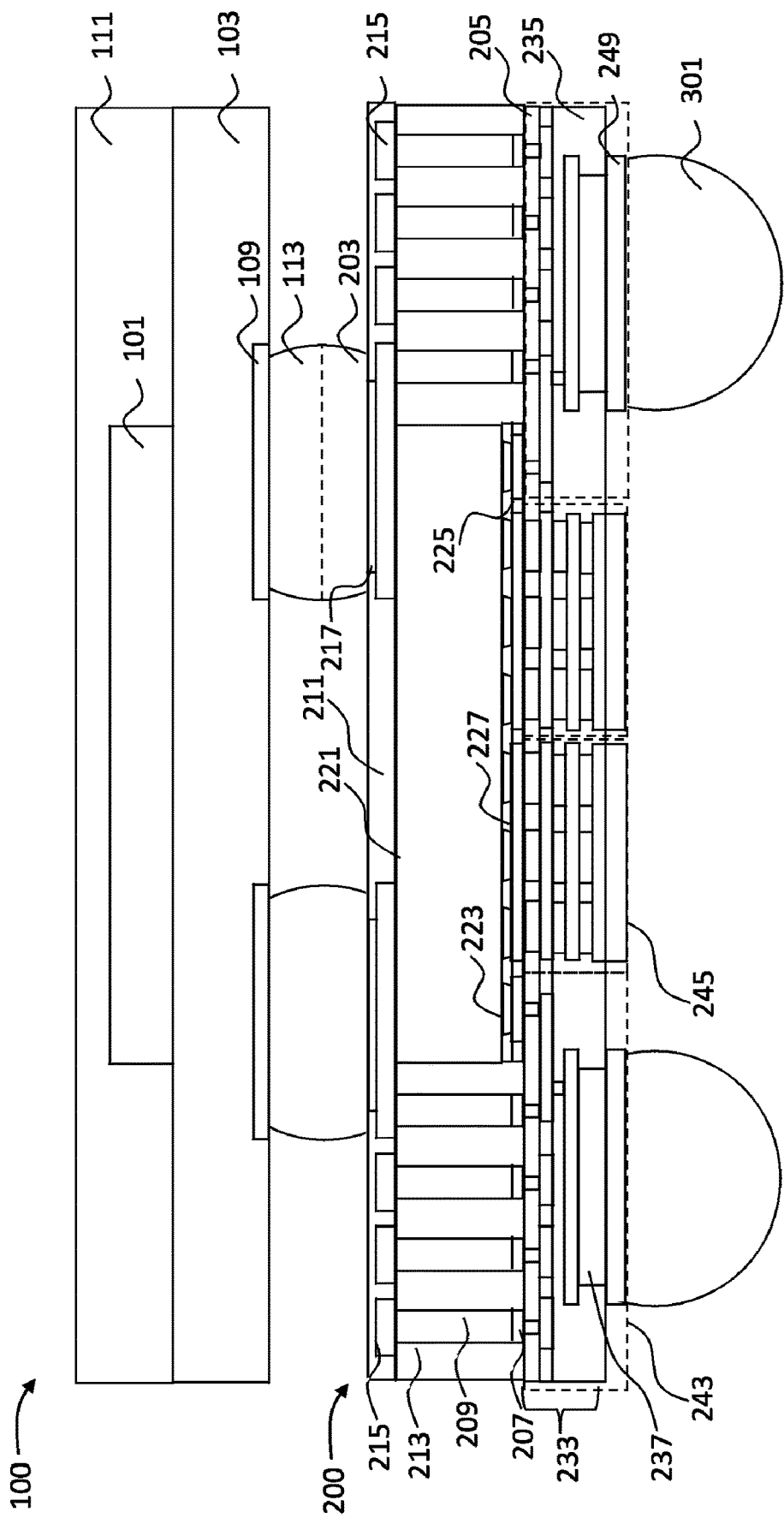
FIG. 3 illustrates a bonding of the first package to the second package in accordance with some embodiments.

FIG. 3 illustrates a bonding of the first package 100 and the second package 200. In an embodiment the first package 100 may be bonded to the second package 200 by initially aligning the first external connections 113 and the second external connections 203. Once in contact, a reflow may be performed to reflow the material of the first external connections 113 and the second external connections 203 to physically and electrically bond the first package 100 to the second package 200. However, any other suitable method of bonding, such as copper-copper bonding, may alternatively be utilized based upon the chosen structure of the first external connections 113 and the second external connections 203, and all such bonding methods are fully intended to be included within the scope of the embodiments.

FIG. 3 also illustrates the formation of third external connections 301 in connection with the third contact pads 249. The third external connections 301 may be contact bumps such as a ball grid array, although any suitable shape and size, such as microbumps, C4 bumps, or the like, may alternatively be utilized. In an embodiment the third external connections 301 comprise a material such as tin, silver, or copper, although any other suitable material may alternatively be utilized. In an embodiment in which the third external connections 301 are tin solder bumps, the third external connections 301 may be formed by initially forming a layer of tin through any suitable method such as evaporation, electroplating, printing, solder transfer, ball placement, etc, to a thickness of, e.g., about 100 μm. Once a layer of tin has been formed on the structure, a reflow is performed in order to shape the material into the desired bump shape.

Figure 4A:
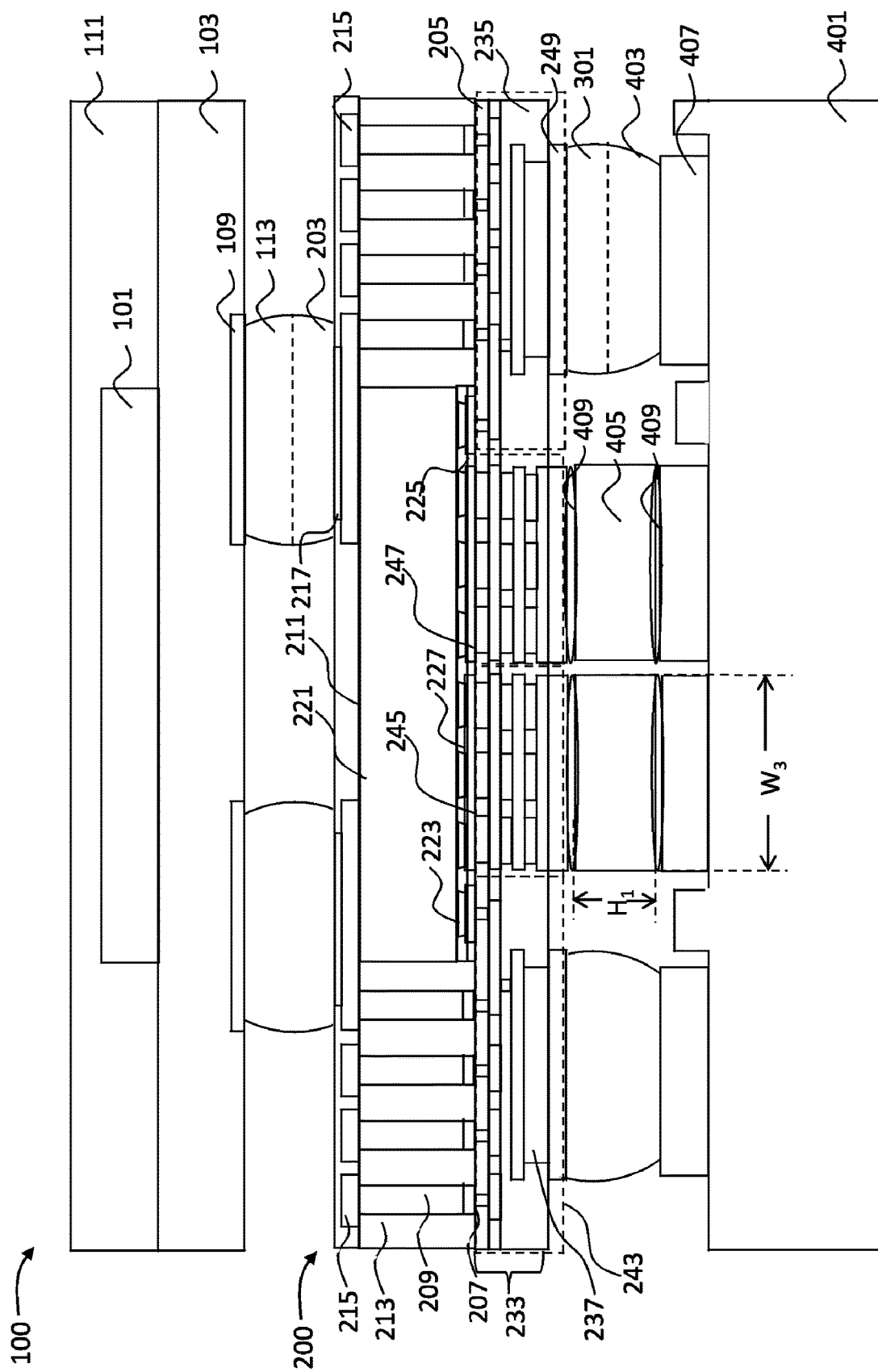
FIGS. 4A-4C illustrate a bonding of the second package using external connections to a substrate in accordance with some embodiments.

FIG. 4A illustrates a bonding of the second package 200 with a second substrate 401 using both fourth external connections 405 as well as fifth external connections 403 (shown in FIG. 4A as already being bonded with the third external connections 301). In an embodiment the second substrate 401 may be, e.g., a printed circuit board that works to interconnect various electrical components to each other in order to provide a desired functionality for a user. Alternatively, the second substrate 401 may be another substrate and comprises multiple conductive layers (not individually illustrated), some of which are inter-layers within the second substrate 401. These layers may be etched into traces of various widths and lengths and connected through inter-layer vias. Together, the lines and vias may form an electrical network to route DC power, ground, and signals from one side of the second substrate 401 to the other. Those of skill in the art will recognize the second substrate 401 may be fabricated from an organic (laminate) material such as bismaleimide-triazine (BT), a polymer-based material such as liquid-crystal polymer (LCP), a ceramic material such as low-temperature co-fired ceramic (LTCC), a silicon or glass interposer, or the like. Those of skill in the art will also recognize the conductive layers and vias may be formed from any suitable conductive material, such as copper, aluminum, silver, gold, other metals, alloys, combination thereof, and/or the like, and formed by any suitable technique, such as electro-chemical plating (ECP), electroless plating, other deposition methods such as sputtering, printing, and chemical vapor deposition (CVD) methods, or the like.

In some embodiments, the second substrate 401 may include electrical elements, such as resistors, capacitors, signal distribution circuitry, combinations of these, or the like. These electrical elements may be active, passive, or a combination thereof. In other embodiments, the second substrate 401 is free from both active and passive electrical elements therein. All such combinations are fully intended to be included within the scope of the embodiments.

The second substrate 401 may comprise fourth contact pads 407 in order to electrically connect the second substrate 401 to, e.g., the second package 200. In an embodiment the fourth contact pads 407 may be similar to the first contact pads 109 (described above with respect to FIG. 1). For example, the fourth contact pads 407 may be aluminum contact pads formed by a deposition and patterning process. However, the fourth contact pads 407 may alternatively be different from the first contact pads 109.

In an embodiment the fifth external connections 403 may be formed to provide an external connection between the fourth contact pads 407 and the third contact pads 249. The fifth external connections 403 may be contact bumps such as a ball grid array, although any suitable shape and size, such as microbumps, C4 bumps, or the like, may alternatively be utilized. In an embodiment the fifth external connections 403 comprise a material such as tin, silver, or copper, although any other suitable material may alternatively be utilized. In an embodiment in which the fifth external connections 403 are tin solder bumps, the fifth external connections 403 may be formed by initially forming a layer of tin through any suitable method such as evaporation, electroplating, printing, solder transfer, ball placement, etc, to a thickness of, e.g., about 100 µm. Once a layer of tin has been formed on the structure, a reflow is performed in order to shape the material into the desired bump shape.

The fourth external connections 405 are used for both electrical connectivity as well as for thermal conductivity. As such, the fourth external connections 405 have different physical properties than the fifth external connections 403. In an embodiment, the fourth external connections 405 are a material with a higher thermal conductivity than the fifth external connections 403 that allow for heat to flow from the second semiconductor device 211, through the power region 245 and the ground region 247, and through the fourth external connections 405. This allows for a better removal of heat from the second semiconductor device 211.

Figure 4B:
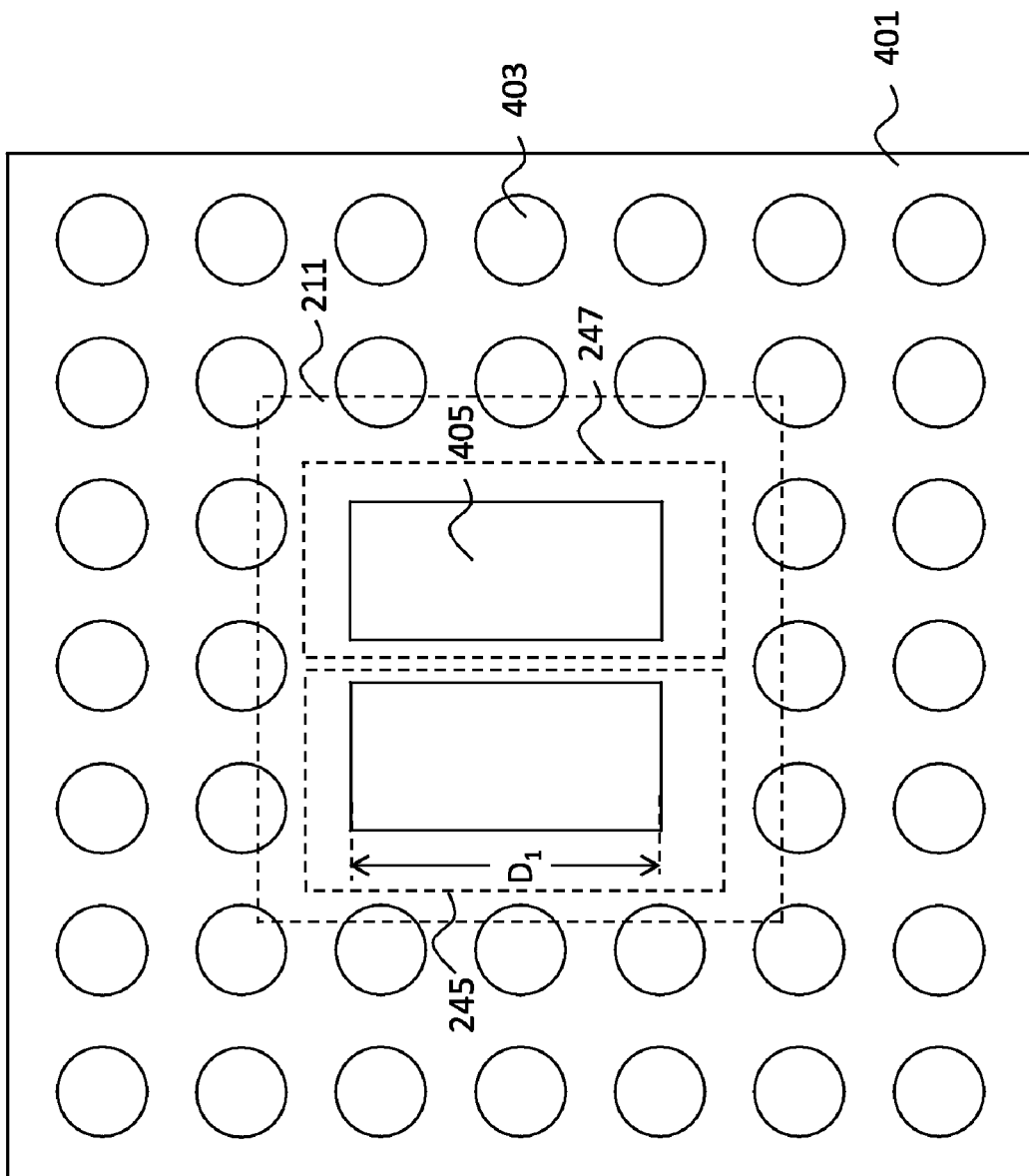

In a particular embodiment the fourth external connections 405 comprise copper, although any other suitably conductive (both electrical as well as thermal) material, such as aluminum or gold, may alternatively be utilized. Additionally, in the embodiment disclosed in FIG. 4A, the fourth external connections 405 made of copper are shaped as a copper block, with a third width $W_3$ of between about 0.2 mm and about 50.0 mm, such as about 1.0 mm, and a first depth $D_1$ (not illustrated in the cross-section of FIG. 4A but located so as to go into and out of the page of FIG. 4A, as illustrated in FIG. 4B) of between about 0.2 mm and about 50.0 mm, such as about 1.0 mm. The fourth external connections 405 have a first height $H_1$ that is sufficient to electrically and thermally interconnect the fourth contact pads 407 to the third contact pads 249. As such, while the precise height dimensions of the first height $H_1$ are at least in part dependent upon the overall design of the device, in an embodiment the first height $H_1$ may be between about 0.1 mm and about 0.3 mm, such as about 0.16 mm.

Alternatively, the fourth external connections 405 may be formed of other materials than simply conductive blocks. Rather, any suitably conductive (both electrically and thermally) type of material, such as conductive foil (e.g., copper foil) or conductive paste (e.g., copper paste), may alternatively be utilized. All such materials are fully intended to be included within the scope of the embodiments.

Additionally, the fourth external connections 405 are not limited by the block shape as described above and in the figures. Rather, any suitable shapes, such as circles, polygons, and other irregular shapes, such as a star, a cross or a U-shape, may also be utilized. All such shapes are fully intended to be included within the scope of the embodiments.

In an embodiment in which the fourth external connections 405 are copper blocks, the fourth external connections 405 may be placed onto the fourth contact pads 407 by initially placing solder flux 409 onto the fourth contact pads 407. The solder flux 409 may be applied by brushing, spraying, a stencil, or other methods, as examples. The solder flux 409 generally has an acidic component that removes oxide barriers, and an adhesive quality that helps to prevent an integrated circuit from moving during the process. The solder flux 409 may be simultaneously placed on the fourth external connections 405 connecting to both the fourth contact pads 407 and the fifth external connections 403 (although these are not illustrated in FIG. 4A for clarity), although, if desired, the solder flux 409 may only be placed onto the fourth external connections 405 connecting to the fourth contact pads 407, or any combinations thereof.

However, while solder flux 409 is described as being used in this embodiment, other types of materials may also be utilized to aid the connection between the fourth external connections 405 and the fourth contact pads 407. Any other suitable material, such as a solder paste, may alternatively be utilized. All such materials are fully intended to be included within the scope of the embodiments.

Once the solder flux 409 is in place, the fourth external connections 405 may be physically placed in contact with the solder flux 409 using, e.g., a pick and place operation, although any suitable placement methodology may alternatively be utilized. Once the fourth external connections 405 are in place, additional solder flux 409 may be placed on the third contact pads 249 and a thermal process may be performed in order to bond the fourth external connections 405 with the fourth contact pads 407 and the third contact pads 249 in the power region 245 and the ground region 247. In a particular embodiment the thermal process may be the reflow process described above to reflow the fifth external connections 403, although a separate thermal process may alternatively be utilized. As such, the reflow process will reflow the fifth external connections 403 as well as bond the fourth external connections 405, the fourth contact pads 407, and the third contact pads 249.

Alternatively, instead of being placed on the fourth contact pads 407, the fourth external connections 405 may be placed on the third contact pads 249 and then bonded to the fourth contact pads 407. Any suitable placement of the fourth external connections 405 between the fourth contact pads 407 and the third contact pads 249 may be utilized, and all such placements are fully intended to be included within the scope of the embodiments.

FIG. 4B illustrates an expanded top down view (with additional ones of the fifth external connections 403 illustrated) of the second substrate 401, the fifth external connections 403 and the fourth external connections 405, with the second semiconductor device 211 illustrated as a dashed box for convenience. As can be seen in this embodiment, the fourth external connections 405 are located within a center of the second semiconductor device 211 (when viewed from this perspective), while the fifth external connections 403 surround the fourth external connections 405 to provide signal connectivity to the second semiconductor device 211.

Figure 4C:
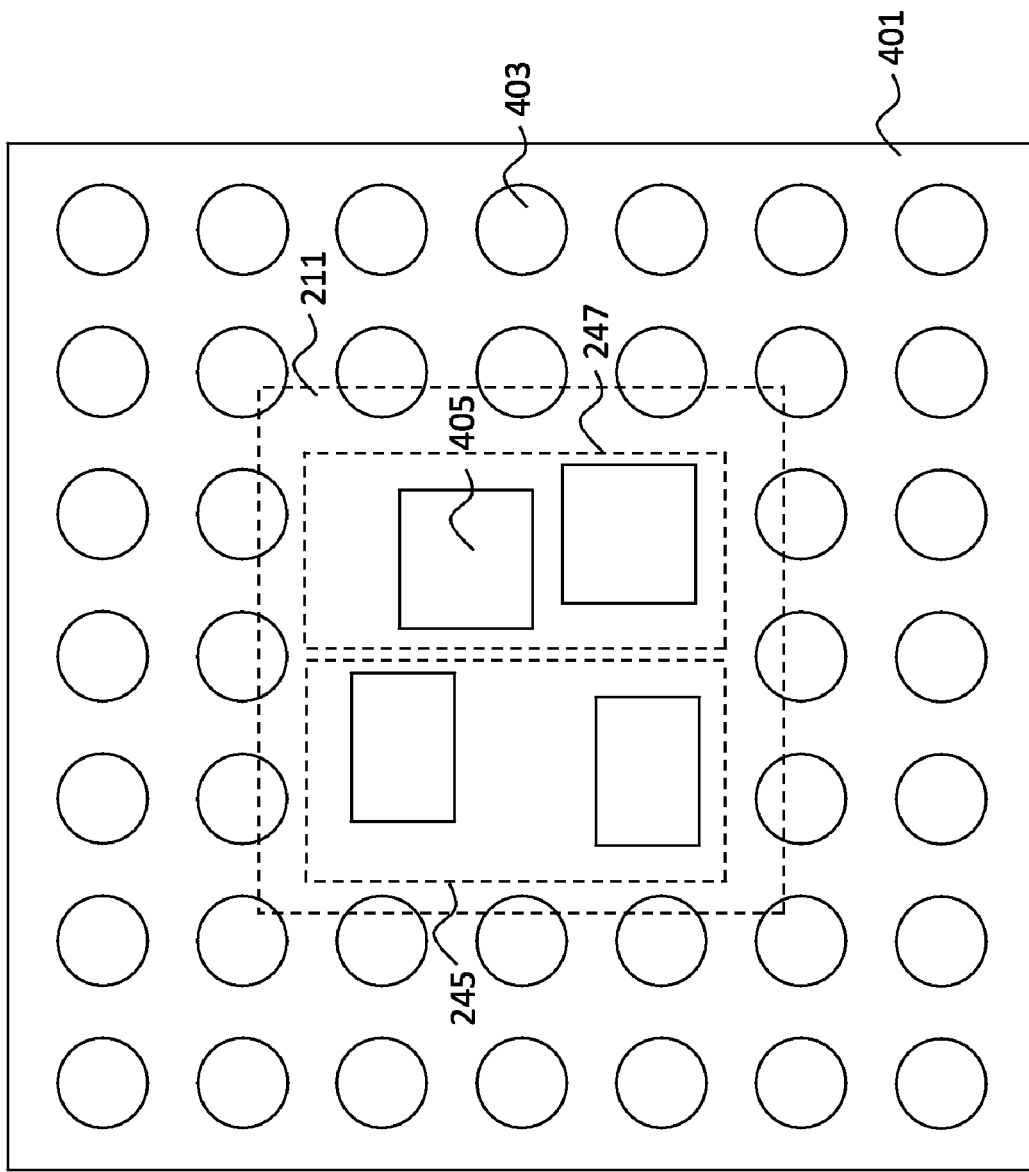

FIG. 4C illustrates another embodiment in which the fourth external connections 405, instead of being a single block within the power region 245 and a single block within the ground region 247, are instead separated into a plurality of blocks, thereby allowing for additional design flexibility. Any suitable number of fourth external connections 405 may be utilized, and all such numbers and combinations are fully intended to be included within the scope of the embodiments.

Figure 5:
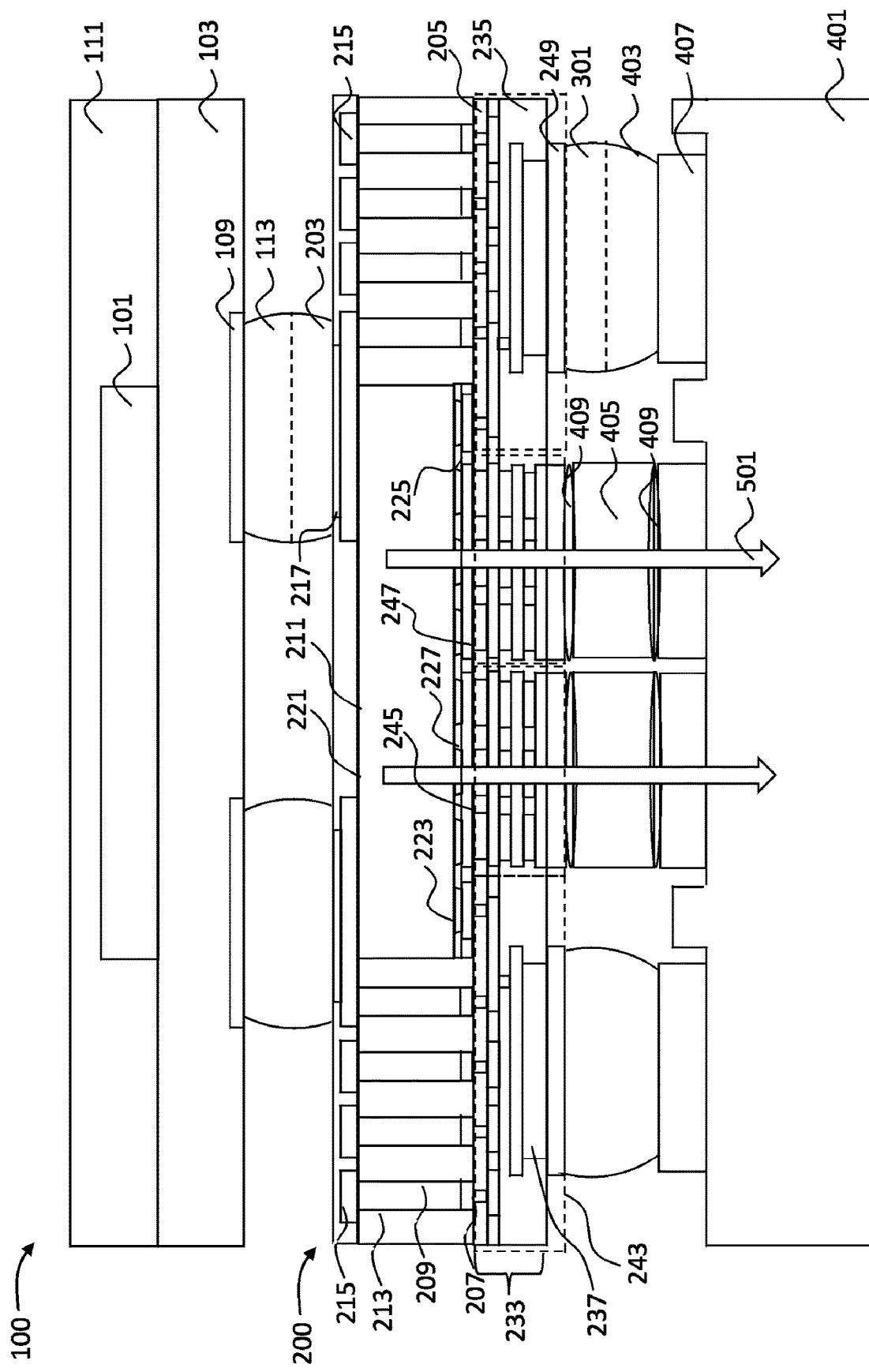
FIG. 5 illustrates a flow of heat in accordance with some embodiments.

FIG. 5 illustrates a flow of heat 501 from the second semiconductor device 211 during, e.g., operation of the second semiconductor device 211. In this embodiment, the heat is initially generated within the second semiconductor device 211, travels through the third metallization layers 233 within the power region 245 and the ground region 247, through the fourth external connections 405, through the fourth contact pads 407, to the second substrate 401, where it can be easily dispersed. By removing this heat from the second semiconductor device 211 quickly, there is less heat accumulation that can have detrimental effects such as lowering the overall performance of the device to causing the individual elements of the second semiconductor device 211 to expand at different rates, causing undesired stresses through differences in coefficients of thermal expansion.

Figure 6:
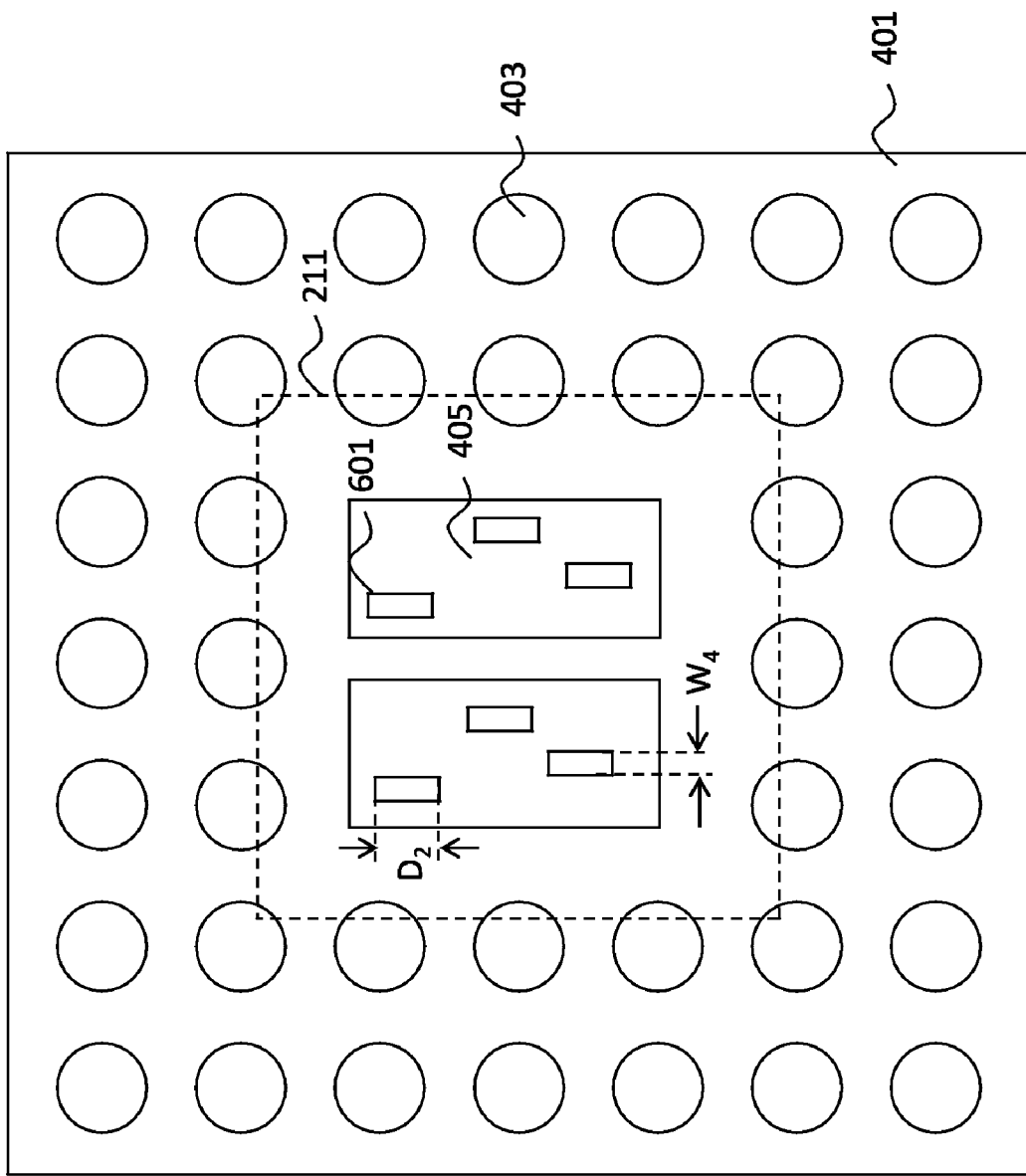
FIG. 6 illustrates slots within the external connections in accordance with some embodiments.

FIG. 6 illustrates another embodiment in which slots 601 are formed within the fourth external connections 405 in order to help compensate for stresses within the fourth external connections 405 that will be generated during removal of heat from the second semiconductor device 211. In an embodiment the slots 601 are openings within the fourth external connections 405, and may be formed using a process such as masking and plating during formation, photolithographic masking and etching after formation, or the like. In an embodiment the individual slots 601 may be formed to have a second depth $D_2$ of between about 0.1 mm and about 0.3 mm, such as about 0.2 mm, and a fourth width $W_4$ of between about 0.1 mm and about 0.3 mm, such as about 0.2 mm.

Additionally, while three slots 601 are illustrated in FIG. 6 within each of the fourth external connections 405, this is intended to be illustrated and is not intended to be limiting to the embodiments. Rather, any suitable number of slots 601, such as between about 1 and about 16, may alternatively be utilized. All suitable number and placement of slots 601 are fully intended to be included within the scope of the embodiments.

Figure 7:
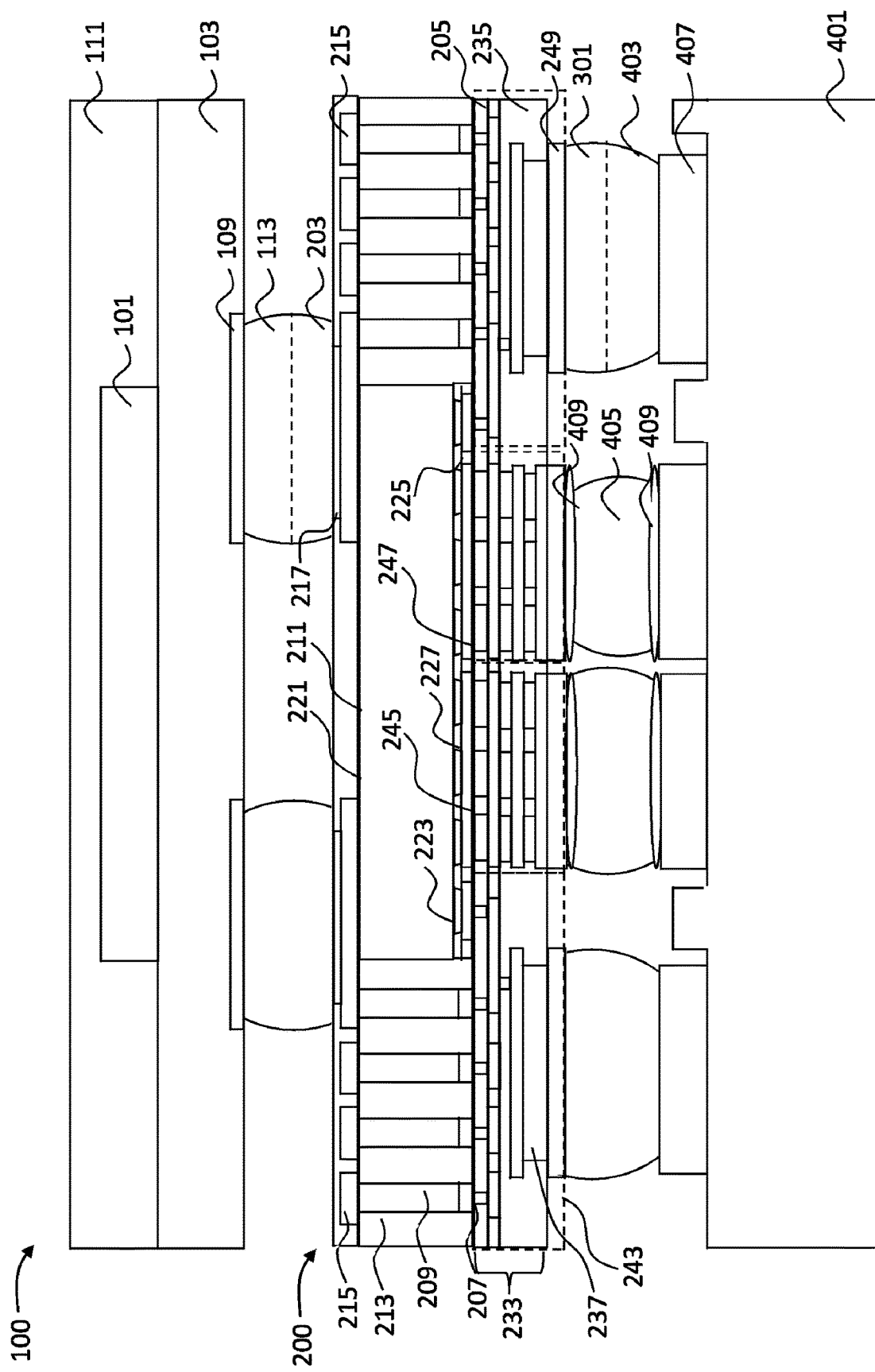
FIG. 7 illustrates an embodiment using balls for the external connections in accordance with some embodiments.

FIG. 7 illustrates another embodiment in which the fourth external connections 405, rather than being a conductive block, is a conductive ball. In this embodiment, the fourth external connections 405 still have a different property from the fifth external connections 403, and may be, e.g., copper balls. In such an embodiment, the fourth external connections 405 are placed on the fourth contact pads 407 in a similar fashion as described above with respect to FIG. 4A, and a thermal process such as a reflow is utilized to bond the fourth external connections 405 to the fourth contact pads 407 and the third contact pads 249.

Figure 8:
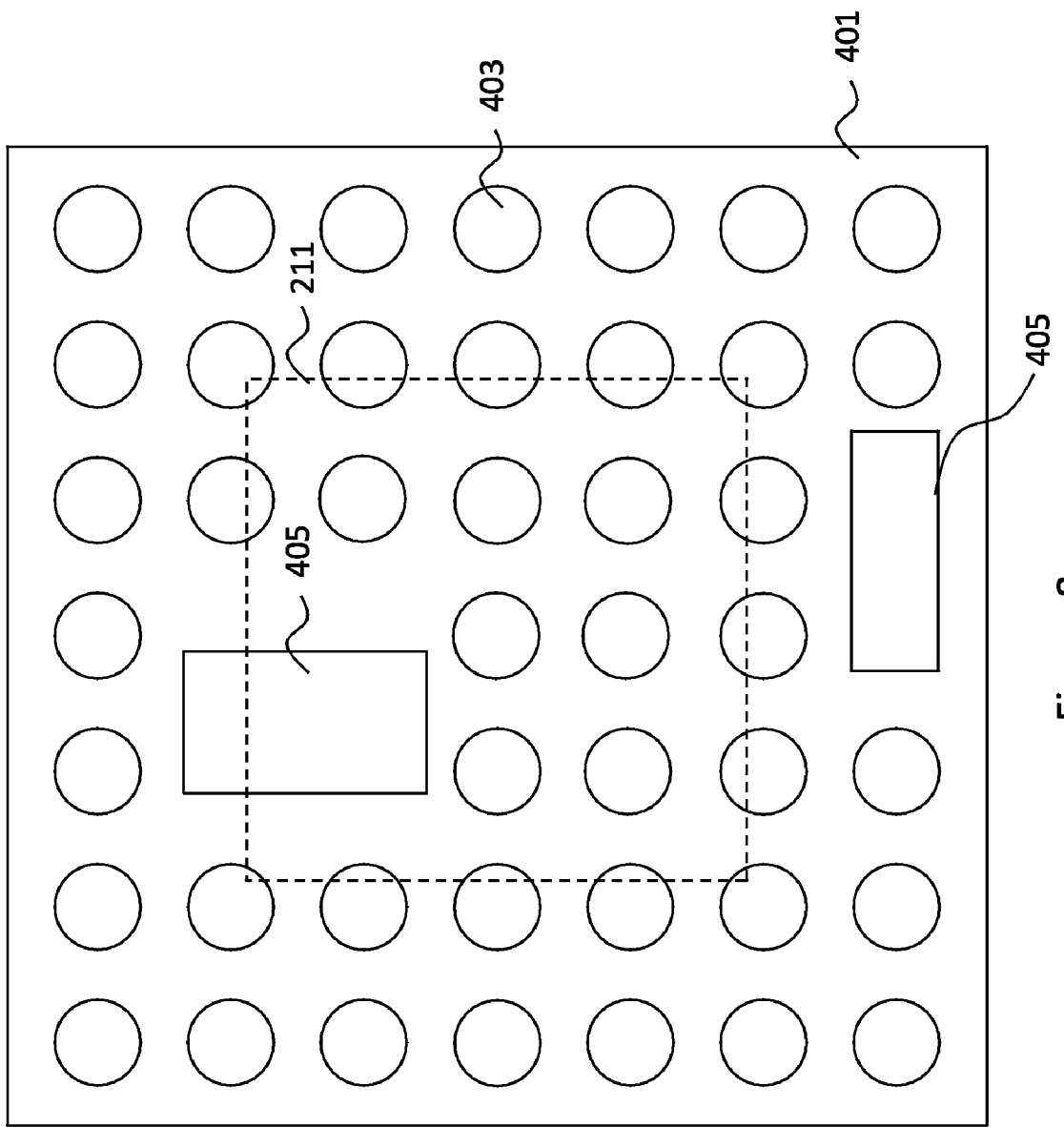
FIG. 8 illustrates placements of the external connections in accordance with some embodiments.

FIG. 8 illustrates yet another embodiment in which the placement of the fourth external connections 405 and, therefore of the flow of heat 501 (see FIG. 5) is not limited to the region directly beneath the second semiconductor device 211. Rather, the fourth external connections 405 may be formed to be partially beneath the second semiconductor device 211 and extending partially away from beneath the second semiconductor device 211. Such a design allows for greater design flexibility while still allowing the flow of heat 501 to remove heat from the second semiconductor device.

FIG. 8 also illustrates another embodiment (used either separately or in conjunction with the embodiments discussed above) in which the fourth external connections 405 and, therefore of the flow of heat 501 (see FIG. 5) is located completely removed from beneath the second semiconductor device 211. Such an embodiment allows for even greater design flexibility while still retaining some of the advantages of the fourth external connections' 405 ability to remove heat from the second semiconductor device.

By utilizing the fourth external connections 405 in order to both electrically and thermally connect the second semiconductor device 211 to the second substrate 401, a thermal removal path may be formed where desired while other connections, such as the fifth external connections 403 may be utilized in areas where thermal issues are not as prevalent. Such a combination allows the heat to be removed from the second semiconductor device 211 faster during both startup (as the fourth external connections 405 will have a higher heat density) as well as during continuous operation, when the second semiconductor device 211 is generating heat continuously (when the fourth external connections 405 have a higher thermal conductance). Such a quick removal allows for fewer defects to occur from higher temperatures.

In accordance with an embodiment, a semiconductor device comprising a first package comprising a first semiconductor die surrounded by an encapsulant and vias through the encapsulant and laterally removed from the first semiconductor die, is provided. A first substrate is bonded to the first package with a first external connection and a second external connection, wherein the second external connection comprises a different material than the first external connection.

In accordance with another embodiment, a semiconductor device comprising an integrated fan out package is provided. A first set of external connections is bonded to a first side of the integrated fan out package, and a second set of external connections is bonded to the first side of the integrated fan out package, wherein the second set of external connections has a higher thermal conductivity than the first set of external connections.

In accordance with yet an embodiment, a method of manufacturing a semiconductor device comprising placing a first set of external connections on a first side of an integrated fan out package is provided. A second set of external connections is placed on the first side of the integrated fan out package, wherein the second set of external connections has a higher thermal conductivity than the first set of external connections. A substrate is bonded to the second set of external connections and the first set of external connections.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming a first set of external connections on a front side of an interconnect structure of a first package, wherein the first set of external connections are on first contact pads in a signal region of the first package; and placing a second set of external connections on the front side of the interconnect structure, wherein the second set of external connections are on second contact pads in a power/ground region of the first package, and wherein the second set of external connections are formed of a different material that has a higher thermal conductivity than a material of the first set of external connections.

2. The method of claim 1, wherein the second set of external connections comprise conductive blocks.

3. The method of claim 2, wherein the second set of external connections comprise copper.

4. The method of claim 1 further comprising bonding the first package to a substrate using the first set of external connections and the second set of external connections to electrically and thermally connect the first package and the substrate, wherein the second set of external connections are attached to the second contact pads by first solder regions, wherein bonding the first package to the substrate comprises attaching the second set of external connections to third contact pads of the substrate through second solder regions, and wherein each of the first solder regions and each of the second solder regions are disposed on opposing surfaces of a corresponding one of the second set of external connections.

5. The method of claim 4, wherein the substrate is a printed circuit board.

6. The method of claim 4, wherein placing the second set of external connections further comprises applying solder flux between the second contact pads of the interconnect structure and the second set of external connections.

7. The method of claim 1, wherein placing the second set of external connections further comprises placing copper foil on the front side of the interconnect structure.

8. The method of claim 1, wherein placing the second set of external connections further comprises placing a conductive paste on the front side of the interconnect structure.

9. The method of claim 1 further comprising bonding the first package to a second package using a third set of external connections, wherein a material of the first set of external connections and the third set of external connections are the same.

10. A method of manufacturing a semiconductor device, the method comprising:
bonding a first package to a second package using a first set of external connections; and
bonding an interconnect structure of the second package to a substrate using a second set of external connections on a signal region of the second package and a third set of external connections on a power/ground region of the second package, wherein a material of the second set of external connections is different from a material of the third set of external connections, and wherein the third set of external connections comprise openings within the third set of external connections.

11. The method of claim 10, wherein bonding the interconnect structure of the second package to the substrate using the second set of external connections comprises reflowing the second set of external connections.

12. The method of claim 10, wherein the material of the third set of external connections has a higher thermal conductivity than the material of the second set of external connections.

13. The method of claim 10, wherein the third set of external connections comprise a copper block.

14. The method of claim 10, wherein the third set of external connections comprise a shape that is a circle, polygon, star, cross, or a U-shape in a top down view.

15. The method of claim 10, wherein the third set of external connections comprise a plurality of conductive blocks having different widths.

16. A method of manufacturing a semiconductor device, the method comprising:
forming vias on a carrier substrate;
positioning a semiconductor die on the carrier substrate adjacent to the vias;
replacing the carrier substrate with an interconnect structure to form a package; and
forming a first set of external connections and a second set of external connections on a front side of the interconnect structure, wherein the first set of external connections are on a signal region of the package and the second set of external connections are on a power/ground region of the package, wherein a thermal conductivity of the second set of external connections is higher than that of the first set of external connections.

17. The method of claim 16, wherein the second set of external connections are surrounded by the first set of external connections.

18. The method of claim 16, wherein the second set of external connections comprise a conductive ball.

19. The method of claim 16, wherein at least portion of the second set of external connections are located does not overlap the semiconductor die.

20. The method of claim 16, wherein the second set of external connections comprise openings within the second set of external connections.

* * * * *